SUPERCONDUCTOR PERSISTENT CURRENT CIRCUIT

Filed May 29, 1959

INVENTORS
JOHN L. ANDERSON
FRANCIS R. HAND
BY John E. Dougherty Jr.
ATTORNEY

United States Patent Office 3,019,354
Patented Jan. 30, 1962

3,019,354

SUPERCONDUCTOR PERSISTENT CURRENT CIRCUIT

John L. Anderson, Poughkeepsie, and Francis R. Hand, Wappingers Falls, N.Y., assignors to International Business Machines Corporation, New York, N.Y., a corporation of New York Filed May 29, 1959, Ser. No. 816,972
10 Claims. (Cl. 307—88.5)

The present invention relates to superconductor circuits and, more particularly, to superconductor storage and transfer circuits which include a plurality of directly coupled persistent current storage loops.

In order to store a persistent current in a loop of superconductor material, it is necessary to apply a current to the loop in such a way as to provide a net flux threading the loop and, thereafter, remove the applied current at a time when the loop is entirely superconductive. Since it is a characteristic of the phenomena of superconductivity that the net flux threading a completely superconductive loop cannot be changed, a persistent current is established in the loop to maintain the net flux threading the loop constant when the externally applied current signal is removed. In accordance with one mode of operation for storing persistent current in superconductor loops, each loop is fabricated to include two current paths which are connected in parallel across the current supply means for the loop. A portion of one of these paths is maintained in a resistive state while a current pulse is being applied to the loop to cause the pulse to be directed into the other of the parallel paths. By causing the applied current pulse to be directed to one of the paths in this way, a net flux threading the loop is provided. Thereafter, the loop is allowed to become completely superconductive and then the applied pulse is terminated causing a persistent current to be established in the loop. In prior superconductor circuits wherein a persistent current in one such loop is used to control the establishing of a persistent current in another of said loops and the circuit operation is such that only one loop at a time is storing a persistent current, buffer type circuits have been provided between the loops, and it has not been thought possible, prior to the subject invention, to couple a plurality of such loops directly one to the other.

In accordance with the principles of the subject invention, superconductor circuits are provided which include two or more superconductor persistent current loops each including two paths connected in parallel across a current source. Each loop includes a control conductor of a first superconductor gating device which has its gate conductor connected in one path of the succeeding loop and a gate conductor of a second superconductor gating device which has its control conductor connected in the other path of the succeeding loop. When a persistent current is stored in one of the loops and a pulse is applied to the succeeding loop, the stored persistent current maintains the gate conductor of the first gating deveice resistive thereby causing the applied pulse to be directed to the other of the parallel paths of the succeeding loop. When the current has been established in this path, the gate conductor of the second gating device is driven resistive thereby quenching the originally stored persistent current in the first loop to allow the gate conductor of the first gating device to become superconductive. The applied current pulse, which has been established in one path of the now completely superconductive loop, is thereafter terminated causing a persistent current to be established in the loop.

A prime object of the subject invention is to provide improved superconductor circuits of the type including a plurality of persistent current loops.

A further object is to provide improved persistent current information storage and information transfer circuits.

A more specific object is to provide an improved persistent current ring circuit.

Still another object is to provide superconductor circuits including a plurality of superconductor persistent current loops which are directly coupled one to the other to enable a persistent current stored in a first loop to directly control a pulse applied to a second coupled loop so that the applied pulse quenches the persistent current stored in the first loop and, upon its termination, establishes a persistent current in the second loop.

A further object is to provide superconductor circuits including a plurality of directly coupled persistent current superconductor loops wherein persistent currents are successively established in the loops under the control of previously established persistent currents and in which a persistent current is stored in only one loop at a time.

The foregoing and other objects, features and advantages of the invention will be apparent from the following more particular description of preferred embodiments of the invention, as illustrated in the accompanying drawings.

Figures 1, 2, 3:
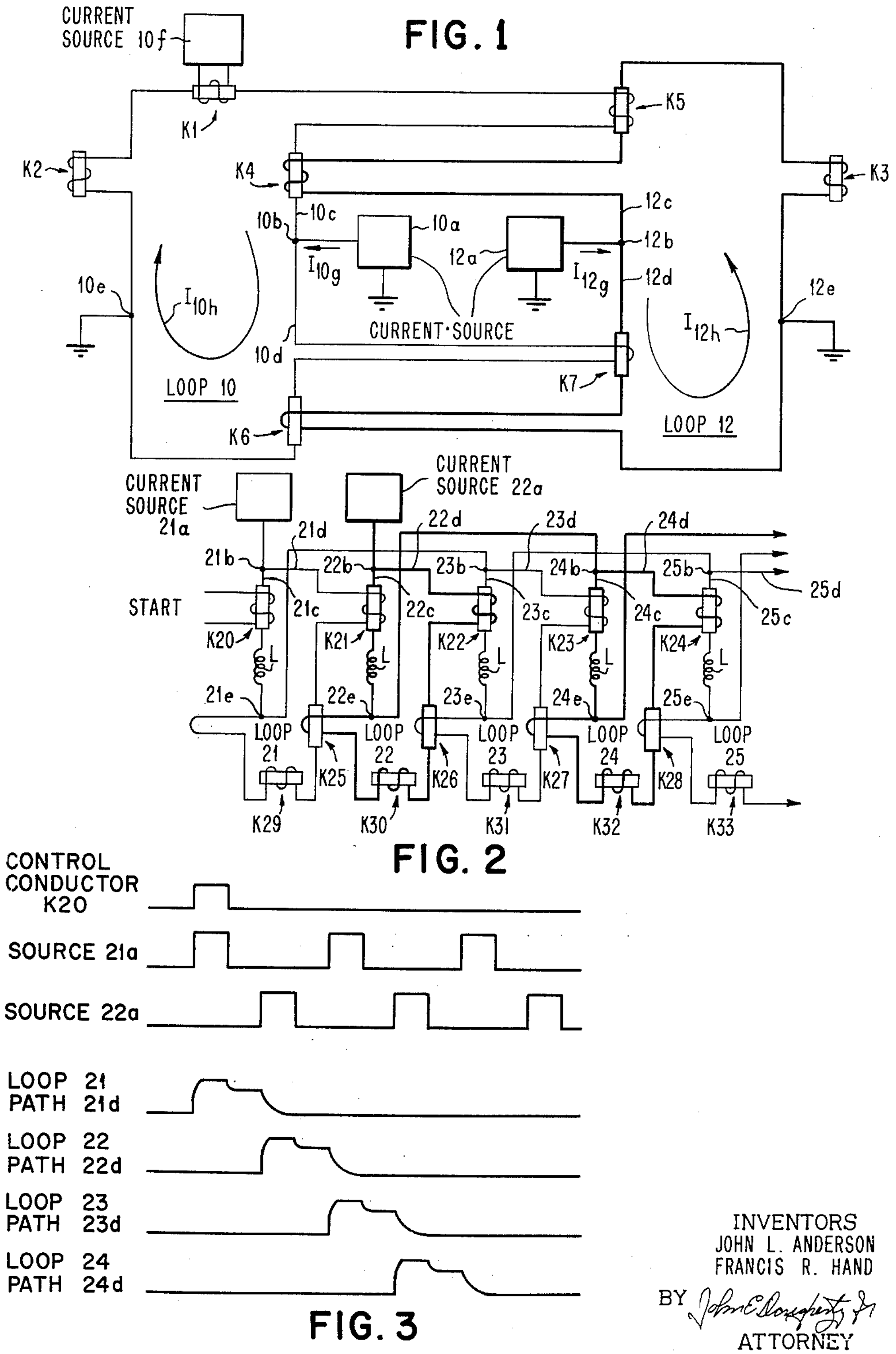
FIG. 1 is a diagrammatic representation of a circuit including two persistent current storage loops so connected that persistent currents are established in each loop directly under the control of a persistent current previously established in the other loop.
FIG. 2 is a diagrammatic representation of a ring circuit including a plurality of directly connected persistent current storage loops.
FIG. 3 is a pulse diagram for the circuit of FIG. 2.

Referring now to the details of the embodiments herein disclosed, FIG. 1 shows a bistable persistent current circuit which includes two persistent current loops that are generally designated 10 and 12. A pair of current sources 10*a* and 12*a* are provided for supplying current to these loops. In order to present a clearer illustration of the circuit, source 12*a* and the circuitry connected to it including loop 12 is shown in heavy lines. Each of the loops is formed of two current paths which are connected in parallel across the current source for that loop. Current source 10*a* is connected to a terminal 10*b* in loop 10 from which a pair of parallel paths 10*c* and 10*d* extend in parallel to a current return or ground terminal 10*e* for the loop. Similarly, source 12*a* is connected to a terminal 12*b* in loop 12 from which a pair of parallel paths 12*c* and 12*d* extend to a ground terminal 12*e* for loop 12.

Seven cryotrons are used in the circuit of FIG. 1 to initially set up the circuit for operation, to thereafter control the establishing of persistent currents alternately in the two loops, and to provide outputs indicative of which of the loops is storing a persistent current at any particular time. These cryotrons are designated K1 through K7 and each is represented as a conventional wire wound cryotron in the interest of providing a more graphic circuit illustration, though it must be understood that the circuit is preferably built using thin film devices of the type, for example, shown and described in copending application, Serial No. 625,512, filed on November 30, 1956, in behalf of R. L. Garwin and assigned to the assignee of the subject invention.

The first of these cryotrons K1 serves as an input cryontron and has its gate connected in path 10*c* of loop 10 and its control conductor connected to a current source 10*f*. Cryotrons K2 and K3 are output cryotrons for loops 10 and 12, respectively. Each of these cryotrons has its control coil connected in the associated loop so that its gate is driven resistive when there is a persistent current stored in the loop. Each of the remaining cryotrons K4, K5, K6, and K7 has its control conductor connected in one of the loops 10 or 12 and its gate conductors connected in the other loop. These cryotrons serve to control the establishing of persistent currents alternately in loops 10 and 12 in response to current pulses applied by sources 10*a* and 12*a*. The current supplied by these sources has a predetermined magnitude, which, for the illustration purposes of this disclosure is designated 10 current units. The design of each of the cryotrons K1, K2, K3, K4, and K5 is such that the gate conductor of each of these cryotrons is driven resistive when its control conductor is carrying a current equal to or greater than 4.5 current units. Cryotrons K6 and K7 are of a different design so that each of these cryotrons requires twice the current, that is, 9 current units, in its control conductor to drive its gate conductor resistive.

The circuit of FIG. 1 is conditioned for operation by storing a persistent current in loop 10. This is accomplished in the following manner. Source 10*f* is actuated to supply a current signal in excess of 4.5 units to the control conductor of cryotron K1 so that the gate of this cryotron is driven resistive and source 10*a* is actuated to apply a current signal of 10 units at terminal 10*b*. When the 10 units of current supplied by source 10*a* have been established completely in path 10*d* of loop 10 because of the presence of the resistive gate of cryotron K1 in path 10*c*, the current signal applied by source 10*f* is terminated allowing the gate of cryotron K1 to become superconductive. Since path 10*d* is superconductive, the entire current from source 10*a* remains in this path after the gate of cryotron K1 becomes superconductive. The final step in the operation is to terminate the current signal supplied by source 10*a*. At the time this signal is terminated, the loop 10 is entirely superconductive and, therefore, there can be no change in the net flux threading this loop. As a result, a persistent current is stored in loop 10 when the signal supplied by source 10*a* is terminated.

The current signal of 10 current units applied by source 10*a* is in the direction indicated by the arrow $I_{10g}$, and the persistent current stored in the loop is, therefore, a clockwise persistent current as indicated by arrow $I_{10h}$. The magnitude of the persistent current stored in the loop is dependent upon the inductance of the two paths which form the loop more specifically, the portion of the current of 10 units applied by source 10*a*, which is stored as a persistent current, is given by the ratio of the inductance of the path in which the current is flowing when the applied current signal is terminated to the total inductance of the loop. Thus, the magnitude of the stored persistent current may be expressed as follows:

$$I_{10h}=\frac{L_{10d}}{L_{10d}+L_{10c}}I_{10g}$$

where $I_{10h}$=the magnitude of the persistent current stored
$I_{10g}$=the magnitude of the current applied by source 10*a* (10 units);
$L_{10d}$=the inductance of path 10*d*; and
$L_{10c}$=The inductance of path 10*c*.

For the loop 10 of FIG. 1, the inductance of path 10*d* is one and one half times the inductance of path 10*c* and, similarly, the inductance of path 12*d* of loop 12 is one and one half times the inductance of path 12*c*. The magnitude of the persistent current $I_{10g}$ established in loop 10 during the set up operation described above is, therefore 6 current units.

The persistent current of 6 units stored in loop 10 flows through the control conductors of cryotrons K2, K5, and K7. Since only 4.5 units of current are required to drive the gates of cryotrons K2 and K5 resistive, these gates are maintained resistive by the persistent current. However, cryotron K7 requires 9 units of current in its control conductor to drive its gate resistive and the gate of this cryotron remains superconductive. Cryotron K2 is an output cryotron and indicates, by the resistive state of its gate, the presence of the persistent current in loop 10. The gate of cryotron K5 is connected in path 12*c* of loop 12 and serves to control the establishing of a persistent current in loop 12 when a pulse is applied by source 12*a* in a manner described below.

The operation to store a persistent current in loop 12 is initiated by actuating source 12*a* to supply a current of 10 units at terminal 12*b* of loop 12. Path 12*d* of loop 12 is, at this time, entirely super conductive and path 12*c* includes the resistive gate of cryotron K5. Thus, after an initial transient, this entire current of 10 units from source 12*a* is directed through path 12*d* to terminal 12*e*. Concerning the above mentioned transient, it must be pointed out that, as the current signal from source 12*a* is being applied, this current initially tends to split between paths 12*c* and 12*d* inversely in proportion to the inductance of these paths. Since the inductance of path 12*d* is one and one half times the inductance of path 10*c*, the 10 units of current from source 12*a* would, in the absence of resistance in path 12*c*, be divided with 6 units of current in path 12*c* and 4 units of current in path 12*d*. In such a case, the 6 units of current in the control coil of cryotron K4 connected in path 12*c* would drive the gate of this cryotron resistive and cause the persistent current in loop 10 to decaly to zero. However, the resistive gate of cryotron K5 causes any current from source 12*a* which is directed into path 12*c* to begin to shift immediately to path 12*d*. The rate at which this shift occurs is determined by the time constant of the loop. The rise time of the current pulse applied by the current source 12*a* and the time constant of the loop for this current shift are such that the transient current signal established in path 12*c* never reaches a magnitude of 4.5 current units.

The gate of cryotron K4, therefore, remains superconductive and the persistent current in loop 10 is undisturbed by the application of the current from scource 12*a* to loop 12 until essentially all of this current, specifically 9 units, is flowing in path 12*d* which includes the control coil of cryotron K6. At this time, the gate of cryotron K6 is driven resistive and the persistent current in loop 10 decays at a rate which is determined by the time constant of the loop. As the persistent current in loop 10 decays from 6 units to zero, the gate of cryotron K5 becomes superconductive when the current in the control coil of this cryotron falls below 4.5 current units. However, by the time the gate of cryotron K5 actually becomes superconductive, the entire current of 10 units applied by source 12*a* has been established in path 12*d*. It should be noted that the gate of cryotron K5 may be designed so that the $I^2R$ heating of this gate caused by the transient current from source 12*a* through the gate when in a resistive state is sufficient to cause the gate to remain resistive for a time after the current in its control coil has fallen below its critical value.

Thus, when a current signal of 10 units is applied by source 12*a* to loop 12, at a time when a persistent current of 6 units is stored in loop 10, the entire current from source 12*a* is directed, under the control of the persistent current in loop 10 flowing in the control conductor of cryotron K5, to path 12*d* of loop 12; and, when this current is established in this path and, therefore, in the control conductor of cryotron K6, the persistent current stored in loop 10 is quenched.

The operation to store a persistent current in loop 12 is completed by terminating the signal applied by source 12*a* after this signal has been established in path 12*d* and the persistent current in loop 10 has been quenched so that the gate of cryotron K5 is superconductive. When the current from source 12*a* is terminated, a counterclockwise persistent current $I_{12h}$ is established in loop 12 and this persistent current has a magnitude of 6 current units. This persistent current flows in the coils of cryotrons K3, K4, and K6. The latter cryotron has a critical control current of 9 units and, therefore, its gate remains superconductive, whereas the gates of cryotrons K3 and K4 are driven resistive. Cryotron K3 is an output cryotron and the resistance exhibited by its gate indicates the presence of the persistent current in loop 12. The gate of cryotron K4 is connected in path 10*c* of loop 10 and serves to control the establishing of persistent current in this loop when a current source 10*a* is actuated.

The operation to store a persistent current in loop 10 when current source 10*a* is actuated with a persistent current of 6 units stored in loop 12 is similar to that described above for storing a persistent current in loop 12 in response to a pulse from source 12*a* applied when a persistent current is stored in loop 10. The resistive gate of cryotron K4 causes the 10 units of current from source 10*a* to be established in path 10*d*. The rise time of the signal from source 10*a* and the time constant of the loop are so related that the transient in path 10*c* does not exceed 4.5 current units. The gate of cryotron K5 remains superconductive and the persistent current in loop 12 is not quenched until the current in control conductor K7 in path 10*d* exceeds 9 current units, and the entire 10 current units from source 10*c* is established in path 10*d* of loop 10 before gate K5 becomes entirely superconductive. When the pulse applied by source 10*a* is terminated, a persistent current of 6 units ($I_{10h}$) is established in loop 10, thereby causing the gate of cryotron K5 in path 12*c* of loop 12 to be driven resistive so that, when source 12*a* is again actuated, a persistent current is stored in loop 12 and the persistent current stored in loop 10 is quenched.

This operation may be repeated with sources 10*a* and 12*a* being alternately actuated to shift the persistent current back and forth between loops 10 and 12. It should be noted that the actuation of source 10*a* at a time when there is a persistent current stored in loop 10, or the actuation of source 12*a* at a time when there is a persistent current stored in loop 12 does not change the stable state of the circuit. Thus, for example, if source 10*a* is actuated with a persistent current $I_{10h}$ of 6 units stored in loop 10, in which case loop 10 is, of course, entirely superconductive, the current from source 10 divides between paths 10*c* and 10*d* inversely in proportion to the inductances of these paths. Six units of the applied current signal are directed into path 10*c* and this current is in a direction opposite to the 6 units of peristent current then flowing in this path so that the net current in path 10*c* is zero. The remaining 4 units of the supply current are directed into path 10*d* and, in this path, the persistent current and applied current are in the same direction so that the net current is equal to 10 units. Therefore, when the pulse of 10 current units applied by source 10*a* is terminated, the operation is the same as described above, and a persistent current $I_{10h}$ of 6 units is again stored in loop 10.

It is important to note that the loops 10 and 12 of the circuit of FIG. 1 control each other directly and do not require an intermediate or buffer stage. Each of the four cryotrons K4, K5, K6, and K7, which control the establishing of persistent currents alternately in loops 10 and 12, has its control conductor connected directly in one loop and its gate conductor connected directly in the other loop. In operation, these cryotrons render a persistent current stored in one loop effective to control the setting up of a persistent current in the other loop and, at the same time, render the current in the other loop effective to quench the persistent current in the first loop. Thus, for example, when a current is supplied by either source 10*a* or 12*a* to loop 10 or 12 at a time when a persistent current is stored in the other loop, this persistent current controls the distribution of the applied current; the current applied to one of the loops, the distribution of which is controlled by the persistent current originally stored in the other loop actually quenches the persistent current in the other loop; and the applied current, when terminated, causes a new persistent current to be established in the loop to which it was applied.

FIG. 2 shows a ring circuit including a plurality of successive stages in the form of loops 21, 22, 23, 24, and 25. The last of these loops is shown in incomplete form to indicate that the circuit may be extended to include any number of similar stages, may be open ended, or may have the last stage connected back to the first stage. As will be apparent from the description of the operation of the circuit, if the ring is to be closed with the last stage connected to the first, there must be an even number of stages in the ring. The operation of the loops 21 through 25 of FIG. 2 in storing persistent currents which, in turn, control the setting up of further persistent currents; is similar to the operation of the loops 10 and 12 of FIG. 1. For this reason, the same letter designations *a*, *b*, *c*, *d*, and *e*, are used in combination with the numerical designations for the loops as are used in FIG. 1. Thus, as loop 10 of FIG. 1 includes two parallel paths 10*c* and 10*d* extending between a pair of terminals 10*b* and 10*e*, to the former of which is connected a current source 10*a*, loop 21 of FIG. 2 includes two parallel paths 21*c* and 21*d*, extending between a pair of terminals 21*b* and 21*e*, and terminal 21*b* is connected to a current supply terminal 21*a*. Each of the other stages 22, 23, 24, and 25 are similarly constructed with the exception that, rather than provide a separate current source for each stage, the odd numbered loops 21, 23, and 25 are connected in series with source 21*a* and the even numbered loops 22 and 24 are connected in series with a current source 22*a* which is connected to terminal 22*b* of loop 22. The entire circuit connected to source 22*a*, including loops 22 and 24, is shown in heavy lines in an effort to make the current diagram easier to follow.

The circuit is initially conditioned for operation by storing a persistent current in loop 21 under control of a cryotron K20. Thereafter, persistent currents are established successively in loops 22, 23, and 24, etc., under control of cryotrons K21 through K28 in response to signals alternately applied by sources 22*b* and 22*a*. The outputs for the circuit are manifested by cryotrons K29 through K33 each of which has its control coil connected in one of the loops and indicates by the state of its gate, superconductive or resistive, whether or not a persistent current is stored in that loop. As in the embodiment of FIG. 1, each of the current sources 21*a* and 22*a* supplies a current of 10 units when actuated. Further, all of the cryotrons in the circuit with the exception of cryotrons K25, K26, K27, and K28 have a critical control conductor of 4.5 current units. Cryotrons K25, K26, K27 and K28 have a critical control conductor current of 9 current units. Before beginning the detailed description of the circuit operation with reference to the pulse diagram of FIG. 3, it should be noted that there is one difference between the loops 10 and 12 of FIG. 1, and the loops 21 through 25 of FIG. 2. In the circuit of the latter figure, the control coil in each of the loops which controls the establishing of a persistent current in the next loop is connected in the "*d*" path of the loop and not in the "*c*" path as are the control coils of cryotrons K4 and K5 in loops 10 and 12 of FIG. 1. The effect of the change on the circuit operation will be explained as the detailed description progresses.

The operation of the circuit of FIG. 2 is, as indicated, in FIG. 3, initiated by applying a current signal to the control coil of cryotron K20. This signal drives the gate of this cryotron resistive so that, when source 21*a* is actuated, to supply a current signal of 10 units at terminal 21_b_, the entire applied current is established in path 21_d_ of loop 21. The current signal applied by source 21_a_ is terminated after cryotron K20 is allowed to become superconductive so that a persistent current is stored in loop 21. The ratio of the inductance of the "_d_" path of loop 21 to the "_c_" path of the loop is two to one so that the magnitude of the stored current is two thirds the applied current, or 6.7 units. The inductance ratio is higher than in the loops of FIG. 1, since the control coil of the cryotron K21, which controls distribution resulting in the storage of a persistent current in loop 22 when source 21_a_ is subsequently actuated, is connected in the "_d_" path of loop 21. The "_c_" path of loop 21, and of the "_c_" path of the other loops are provided with inductors L which are inserted to achieve the desired inductance ratio. It is possible to connect the control coils of cryotrons K21 through K24 in the "_d_" paths of the loops of FIG. 2, since each loop in this circuit controls the establishing of persistent currents in the next loops in the ring and the loops are not coupled as in the case with the two loops 10 and 12 in the circuit of FIG. 1 so that each loop, in turn, controls the storing of persistent currents in the other loop.

With the persistent current of 6.7 units stored in loop 21, the control coil of cryotron K21 holds the gate of this cryotron resistive so that, when the first pulse is applied by source 22_a_, the entire applied current, after the initial transient is directed into path 22_d_ of this loop. When the current in this path exceeds 9 current units, the gate of cryotron K25 is driven resistive to cause the persistent current in loop 21 to begin to decay thereby allowing the gate of cryotron K21 to again become superconductive. This gate does not become entirely superconductive until the entire 10 units of current supplied by source 22_a_ is established in path 22_d_ of loop 22. Therefore, when the applied signal is terminated, a persistent current of 6.7 units is stored in loop 22. The persistent current is stepped stage by stage in the ring circuit by alternately actuating the current sources 21_a_ and 22_a_. The second pulse applied by source 21_a_, as indicated in FIG. 3, causes a persistent current to be established in loop 23 and the persistent current in loop 22 to be quenched; the next pulse applied by source 22_a_ causes the persistent current established in loop 23 to be quenched and a persistent current to be established in loop 24, etc.

It should be noted that unlike the cryotrons K4 and K5 of the circuit of FIG. 1, cryotrons K21, K22, K23, K24, and K25, which have their control coils connected in the "_d_" paths of the associated loops, are driven resistive by the pulse applied to the loop by the associated one of the current sources 21_a_ and 22_a_. Therefore, the gates of each of these cryotrons are driven resistive even before a persistent current is established in the preceding loop. For example, the gate of cryotron K22 is driven resistive when 4.5 current units of the pulse applied by source 22_a_ is directed into path 22_d_ of loop 22 under the control of a persistent current stored in loop 21 holding the gate of cryotron K21 resistive. Cryotron K22 remains resistive when the persistent current is stored in loop 22 since the magnitude of the persistent current is 6.7 units. However, even though this cryotron is actually driven resistive before a persistent current is stored in loop 22, it does not affect the circuit operation until when, after the setting up of a persistent current in loop 22, source 21_a_ is again actuated to advance the ring one step by establishing a persistent current in loop 23. The control coils of the cryotrons K21 through K25 may, if desired, be connected in the "_c_" paths of the associated loops as is the case with loops 10 and 12 of FIG. 1, in which case the actual operation is the same as for the structure shown as long as the inductance values of the parallel paths are in a ratio of two to one. The inductances of the various paths may be changed by changing the length or cross sectional dimensions of the conductors forming the paths; by adding padding inductors such as, for example, coils L of FIG. 2; where thin film type conductors and devices are employed, and magnetic shields are provided, the inductances of a path may be increased by removing a portion of the shield beneath a portion of the path.

As is the case in the circuit of FIG. 1, the information bit represented by the stored persistent current is advanced only by alternately actuating sources 21_a_ and 22_a_ When either one of these current sources is actuated a number of times in succession without pulses being alternately applied by the other source, there is no change in the stable states of the stages forming the ring. Further, it should be pointed out that, when either of the sources 21_a_ or 22_a_ is actuated to advance the ring one step, the applied signal establishes a persistent current only in the loop next following a loop in which a persistent current has been previously stored. All of the other series connected loops to which the signal from the actuated source are applied remain entirely superconductive so that, when the applied signal is terminated, they return to their initial state with no stored current.

While the invention has been particularly shown and described with reference to preferred embodiments thereof, it will be understood by those skilled in the art that various changes in form and details may be made therein without departing from the spirit and scope of the invention.

What is claimed is:

1. In a superconductor circuit; first and second superconductor persistent current storage loops; each said loop comprising first and second current paths extending between first and second current terminals for the loop; means for storing persistent current in said first loop; first and second superconductor gating devices each comprising a superconductor gate conductor and a superconductor control conductor for controlling the state, superconductive or normal of the gate conductor; the gate conductor of said first gating device and the control conductor of said second device being connected respectively in the first and second paths of said second loop; the control conductor of said first gating device and the gate conductor of said second gating device being connected in said first loop; said persistent current in said first loop flowing through the control conductor of said first gating device maintaining the gate conductor of said first gating device in a resistive state; current supply means connected to said second loop actuable to apply a current flowing between the first and second terminals of said second loop; said resistive gate of said first gating device controlling the current applied by said current supply means to be directed to the second current path of said second loop; said current flowing in said second current path of said second loop and through the control conductor of said second gating device therein driving the gate conductor of said second gating device into a resistive state to quench the persistent current in said first loop and thereby allow the gate conductor of said first gating device to become superconductive; whereby upon termination of said current applied by said current supply means to said second loop, a persistent current is stored in said second loop.

2. In a superconductor circuit; a plurality of superconductor loops for storing persistent currents; current supply means electrically connected to said loops for supplying current signals thereto; each said signal when terminated being effective to cause persistent current to be established in one of said loops; the one of said loops in which a persistent current is established being determined by the one of said loops wherein a persistent current is stored when said signal is supplied by said current supply means; each said loop including a gate conductor of a first superconductor gating device controlled by a control conductor connected in an associated one of said loops and a control conductor means of a second superconductor gating device having its gate conductor means connected in the associated one of said loops; whereby, when a signal is applied to any particular one of said loops with a persistent current stored in the associated loop, said applied signal is controlled in the particular loop by the persistent current stored in the associated loop to be effective to cause the persistent current in the associated loop to be quenched and a persistent current to be established in a particular loop when the applied signal is terminated.

3. The circuit of claim 2 wherein the current required in the control conductors of each said first gating device to drive the gate conductor thereof resistive is less than the current required in the control conductor of each said second gating device to drive the gate conductor thereof resistive; whereby, the persistent current stored in each loop upon termination of a signal applied thereto with a persistent current stored in the associated loop is essentially equal in magnitude to the persistent current originally stored in said associated loop.

4. In a superconductor circuit; a plurality of superconductor loops for storing persistent currents; current supply means electrically connected to said loops for applying current signals thereto; each said loop having connected therein gate conductor means controlled by control conductor means connected in an associated one of said loops and control conductor means arranged to control gate conductor means connected in said associated one of said loops; whereby, when a signal is applied by said signal means to any particular one of said loops at a time when a persistent current is stored in the associated loop, the persistent current in the associated loop is quenched and upon termination of the signal a persistent current is established in the particular loop.

5. In a superconductor circuit; a plurality of superconductor loops for storing persistent currents; said superconductor loops being directly coupled one to the other to form a ring circuit; each said loop having connected therein a superconductor gate conductor controlled by a control conductor connected in a preceding loop in said ring and a control conductor arranged to control a gate conductor connected in the preceding loop in said ring; whereby when a signal is applied to any particular one of said loops at a time when a persistent current is stored in the preceding loop, the persistent current in the preceding loop is quenched and a persistent current is established in the particular loop.

6. In a superconductor circuit; a plurality of superconductor persistent current storage loops forming a ring circuit; each said loop including first and second current paths connected in parallel between first and second terminals for the loop; a plurality of superconductor gating devices each including a gate conductor and a control conductor for controlling the state, superconductive or normal, of the gating device; each of said loops having the gate conductor of one of said gating devices connected in the first path thereof and having connected in the second path thereof the gate conductor of another gating device and the control conductor of still two other gating devices of said plurality of gating devices; the control conductor for the gating device connected in the first path of each said loop being one of the control conductors connected in the second path of the preceding loop in the ring; the control conductor for the gate conductor in the second path of each loop being the other control conductor connected in the second path of the succeeding loop in the ring; means for establishing a persistent current in a first loop of said ring and for thereafter applying current pulses first to alternate ones of said loops and then to remaining ones of said loops; each said applied pulse causing the persistent current stored in one of said loops to be quenched and a persistent current to be stored in the succeeding one of said loops in the ring; whereby there is a persistent current stored in only one of said loops at a time.

7. In a superconductor circuit; a plurality of superconductor loops forming a ring; means for establishing a persistent current in a first one of said loops and thereafter applying current signals to the remaining ones of said loops in succession; each of the remaining ones of said loops including a gate conductor of a superconductor gating device controlled between superconductive and resistive states by a control conductor connected in the preceding loop in the ring and a control conductor for controlling between superconductive and resistive states a gate conductor connected in said preceding loop; whereby each of said succession of current pulses applied to said loops is controlled by the persistent current then stored in one of said loops to quench the stored persistent current and upon its termination to cause a persistent current to be established in the succeeding loop.

8. In a superconductor circuit; a plurality of persistent current storage loops forming a ring circuit; first and second alternately actuated current supply means; said first current supply means being connected to the first and alternate ones of said loops in said ring; said second current supply means being connected to the second and alternate ones of said loops in said ring; each of said loops including superconductor control conductor means of a first superconductor gating device for controlling between superconductive and resistive states the gate conductor of said first gating device which is connected in the succeeding loop and including superconductor gate conductor means of a second gating device which is controlled by control conductor means connected in the succeeding loop in said ring; whereby, when a persistent current is stored in said first loop, each of the pulses alternately applied by said second and first current supply means causes the persistent current then stored in one of said loops to be quenched and establishes a persistent current in the succeeding one of said loops.

9. The circuit of claim 8 wherein the critical control conductor current for each of said first superconductor gating devices is essentially twice the critical control current for each of said second superconductor gating devices.

10. The circuit of claim 8 wherein each of said loops includes first and second current paths connected in parallel with respect to the one of said current supply means to which the loop is connected and the inductance of one of said paths is greater by at least one half than the inductance of the other of said paths.

References Cited in the file of this patent

UNITED STATES PATENTS

| | | |
|---|---|---|
| 2,832,897 | Buck | Apr. 29, 1958 |
| 2,877,448 | Nyberg | Mar. 10, 1959 |
| 2,913,881 | Garwin | Nov. 24, 1959 |

OTHER REFERENCES

"The Cryotron—a Superconductive Computer Component" (Buck II), April 1956, Proceedings of the I.R.E., pp. 482–493.

"Persistent Current Ring Counter" (Anderson et al.), I.B.M. Technical Disclosure Bulletin, vol. 2, No. 2, August 1959, pp. 53–54.